(12) United States Patent
Mori

(10) Patent No.: US 12,072,253 B2
(45) Date of Patent: Aug. 27, 2024

(54) DEFORMATION SENSOR FOR STRING SHAPE ARTICLE

(71) Applicant: Murata Manufacturing Co., Ltd., Nagaokakyo (JP)

(72) Inventor: Kenichi Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 274 days.

(21) Appl. No.: 17/839,744

(22) Filed: Jun. 14, 2022

(65) Prior Publication Data
US 2022/0307926 A1    Sep. 29, 2022

Related U.S. Application Data

(63) Continuation of application No. PCT/JP2021/020273, filed on May 27, 2021.

(30) Foreign Application Priority Data

Jun. 1, 2020   (JP) ................................ 2020-095216

(51) Int. Cl.
*G01L 1/16* (2006.01)
*G01B 7/16* (2006.01)
*H01L 41/113* (2006.01)
*H01L 41/193* (2006.01)
*H10N 30/30* (2023.01)
(Continued)

(52) U.S. Cl.
CPC ................. *G01L 1/16* (2013.01); *G01B 7/16* (2013.01); *H10N 30/302* (2023.02); *H10N 30/857* (2023.02); *H10N 30/87* (2023.02)

(58) Field of Classification Search
CPC .................................... G01L 1/16; G01B 7/16
See application file for complete search history.

(56) References Cited

U.S. PATENT DOCUMENTS

| 5,207,230 | A | 5/1993 | Bowers | |
|---|---|---|---|---|
| 10,446,738 | B2 * | 10/2019 | Ando | ....................... G01B 7/16 |
| 11,877,516 | B2 * | 1/2024 | Ando | .................... H10N 30/857 |

(Continued)

FOREIGN PATENT DOCUMENTS

| JP | 16323846 A | 11/1994 |
|---|---|---|
| JP | 201257999 A | 3/2012 |

(Continued)

OTHER PUBLICATIONS

International Search Report in PCT/JP2021/020273, mailed Jul. 6, 2021, 3 pages.

*Primary Examiner* — Andre J Allen
(74) *Attorney, Agent, or Firm* — ArentFox Schiff LLP

(57) ABSTRACT

A sensor that includes a first film having a first main surface and a second main surface, the first film generating a charge according to a deformation amount of the first film; a first electrode on the first main surface; a second electrode on the second main surface; and a first fixing member and a second fixing member constructed to fix the first film, the first electrode, and the second electrode to an article. The first film is dimensioned to occupy an area equal to or more than half a peripheral surface of the article. The second electrode is located closer to the article than the first electrode. The first fixing member is separated from the second fixing member in an extending direction of the article.

19 Claims, 15 Drawing Sheets

(51) Int. Cl.
*H10N 30/857* (2023.01)
*H10N 30/87* (2023.01)

(56) References Cited

U.S. PATENT DOCUMENTS

| | | |
|---|---|---|
| 2014/0049137 A1 | 2/2014 | Ando et al. |
| 2018/0356912 A1* | 12/2018 | Yamaguchi ............... G06F 3/03 |
| 2019/0240449 A1 | 8/2019 | Nishizawa |

FOREIGN PATENT DOCUMENTS

| | | |
|---|---|---|
| WO | 2012137897 A1 | 10/2012 |
| WO | 2018084155 A1 | 5/2018 |
| WO | 2018173429 A1 | 9/2018 |

* cited by examiner

L↔R

L↔R

L↔R

DEFORMATION SENSOR FOR STRING SHAPE ARTICLE

CROSS REFERENCE TO RELATED APPLICATIONS

The present application is a continuation of International application No. PCT/JP2021/020273, filed May 27, 2021, which claims priority to Japanese Patent Application No. 2020-095216, filed Jun. 1, 2020, the entire contents of each of which are incorporated herein by reference.

FIELD OF THE INVENTION

The present invention relates to a sensor that detects deformation of an article having a string shape.

BACKGROUND OF THE INVENTION

As an invention related to a conventional sensor, for example, a grip detection sensor described in Patent Document 1 is known. The grip detection sensor includes a piezoelectric film, a first electrode, and a second electrode. The piezoelectric film has an elongated band shape. The piezoelectric film has a first main surface and a second main surface. The first electrode is provided on the first main surface of the piezoelectric film. The second electrode is provided on the second main surface of the piezoelectric film. The grip detection sensor is helically wound around a peripheral surface of a tube. Accordingly, when the tube is bent, the piezoelectric film deforms. As a result, signals corresponding to deformation of the piezoelectric film are output from the first electrode and the second electrode.
Patent Document 1: WO 2018/173429 A

SUMMARY OF THE INVENTION

The grip detection sensor of Patent Document 1 may fail to detect accurately deformation of the tube. For example, when the tube deforms to be bent, a portion of the piezoelectric film located on an outer peripheral side of the tube deforms to be stretched by tensile stress. At this time, for example, a positive charge is generated in a portion of the piezoelectric film located on the outer peripheral side of the tube. On the other hand, a portion of the piezoelectric film located on an inner peripheral side of the tube deforms so as to be compressed by compressive stress. At this time, for example, a negative charge is generated in a portion of the piezoelectric film located on the inner peripheral side of the tube. As a result, the charges generated in the piezoelectric film are canceled out. As a result, the grip detection sensor of Patent Document 1 may fail to accurately detect deformation of the tube.

Therefore, an object of the present invention is to provide a sensor capable of detecting deformation of an article having a string shape.

A sensor according to an embodiment of the present invention is a sensor that detects deformation of an article having a string shape, the sensor including: a first film having a first main surface and a second main surface, the first film generating a charge according to a deformation amount of the first film; a first electrode on the first main surface; a second electrode on the second main surface; and a first fixing member and a second fixing member constructed to fix the first film, the first electrode, and the second electrode to the article, wherein the first film is dimensioned to occupy an area equal to or more than half a peripheral surface of the article, the second electrode is located closer to the article than the first electrode, and the first fixing member is separated from the second fixing member in an extending direction of the article.

In the present specification, an axis or a member extending in a front-back direction does not necessarily indicate only the axis or the member parallel to the front-back direction. The axis or the member extending in the front-back direction is an axis or a member inclined within a range of ±45° with respect to the front-back direction. Similarly, an axis or a member extending in an up-down direction is an axis or a member inclined within a range of ±45° with respect to the up-down direction. An axis or a member extending in a left-right direction is an axis or a member inclined within a range of ±45° with respect to the left-right direction.

Hereinafter, a first member, a second member, and a third member are structures included in the sensor. In the present specification, a case where the first member is supported by the second member includes an arrangement where the first member is attached to the second member so as not to be movable with respect to the second member (i.e., it is fixed or held) and an arrangement where the first member is attached to the second member so as to be movable with respect to the second member. Further, the case where the first member is supported by the second member includes both an arrangement where the first member is directly attached to the second member and an arrangement where the first member is attached to the second member via the third member.

In the present specification, the first member and the second member arranged in the front-back direction indicate the following states. When the first member and the second member are viewed in a direction perpendicular to the front-back direction, both the first member and the second member are arranged on any straight line indicating the front-back direction. In the present specification, the first member and the second member arranged in the front-back direction when viewed in the up-down direction indicate the following states. When the first member and the second member are viewed in the up-down direction, both the first member and the second member are arranged on any straight line indicating the front-back direction. In this case, when the first member and the second member are viewed in the left-right direction that is different from the up-down direction, one of the first member and the second member does not have to be arranged on any straight line indicating the front-back direction. Note that the first member and the second member may be in contact with each other. The first member and the second member may be separated from each other. The third member may be present between the first member and the second member. This definition also applies to directions other than the front-back direction.

In the present specification, a state in which the first member is disposed in front of the second member refers to the following state. A part of the first member is disposed in a region through which the second member passes when the second member moves in parallel in a forward direction. Therefore, the first member may be accommodated in the region through which the second member passes when the second member moves in parallel in the forward direction or may protrude from the region through which the second member passes when the second member moves in parallel in the forward direction. In this case, the first member and the second member are arranged in the front-back direction. This definition also applies to directions other than the front-back direction.

In the present specification, a state in which the first member is disposed in front of the second member when viewed in the left-right direction refers to the following state. When viewed in the left-right direction, the first member and the second member are arranged in the front-back direction, and when viewed in the left-right direction, a part of the first member facing the second member is disposed in front of the second member. In this definition, the first member and the second member are not limited to being arranged in the front-back direction in three dimensions. This definition also applies to directions other than the front-back direction.

In the present specification, a state in which the first member is disposed before the second member refers to the following state. The first member is disposed in front of a plane passing through a front end of the second member and orthogonal to the front-back direction. In this case, the first member and the second member may be arranged in the front-back direction or do not have to be arranged in the front-back direction. This definition also applies to directions other than the front-back direction.

In the present specification, each portion of the first member is defined as follows unless otherwise specified. A front portion of the first member means a front half of the first member. A rear portion of the first member means a rear half of the first member. A left portion of the first member means a left half of the first member. A right portion of the first member means a right half of the first member. An upper portion of the first member means an upper half of the first member. A lower portion of the first member means a lower half of the first member. A front end of the first member means a forward end of the first member. A rear end of the first member means a backward end of the first member. A left end of the first member means a leftward end of the first member. A right end of the first member means a rightward end of the first member. An upper end of the first member means an upward end of the first member. A lower end of the first member means a downward end of the first member. A front end portion of the first member means a front end of the first member and the vicinity thereof. A rear end portion of the first member means a rear end of the first member and the vicinity thereof. A left end portion of the first member means a left end of the first member and the vicinity thereof. A right end portion of the first member means a right end of the first member and the vicinity thereof. An upper end portion of the first member means an upper end of the first member and the vicinity thereof. A lower end portion of the first member means a lower end of the first member and the vicinity thereof.

In the present specification, "the first member and the second member are electrically connected" includes the following two meanings. The first meaning is that a direct current can flow between the first member and the second member due to physical contact between the first member and the second member. The second meaning is that a direct current can flow through the first member and the second member due to the first member and the third member being in physical contact with each other and the third member and the second member being in physical contact with each other. In the second meaning, the first member and the second member may be in physical contact with each other or do not have to be in physical contact with each other. In the second meaning, the third member may be a single member or may include a plurality of members.

The sensor according to the present invention can detect deformation of the article having a string shape.

DETAILED DESCRIPTION OF THE INVENTION

Embodiment

Figure 1:
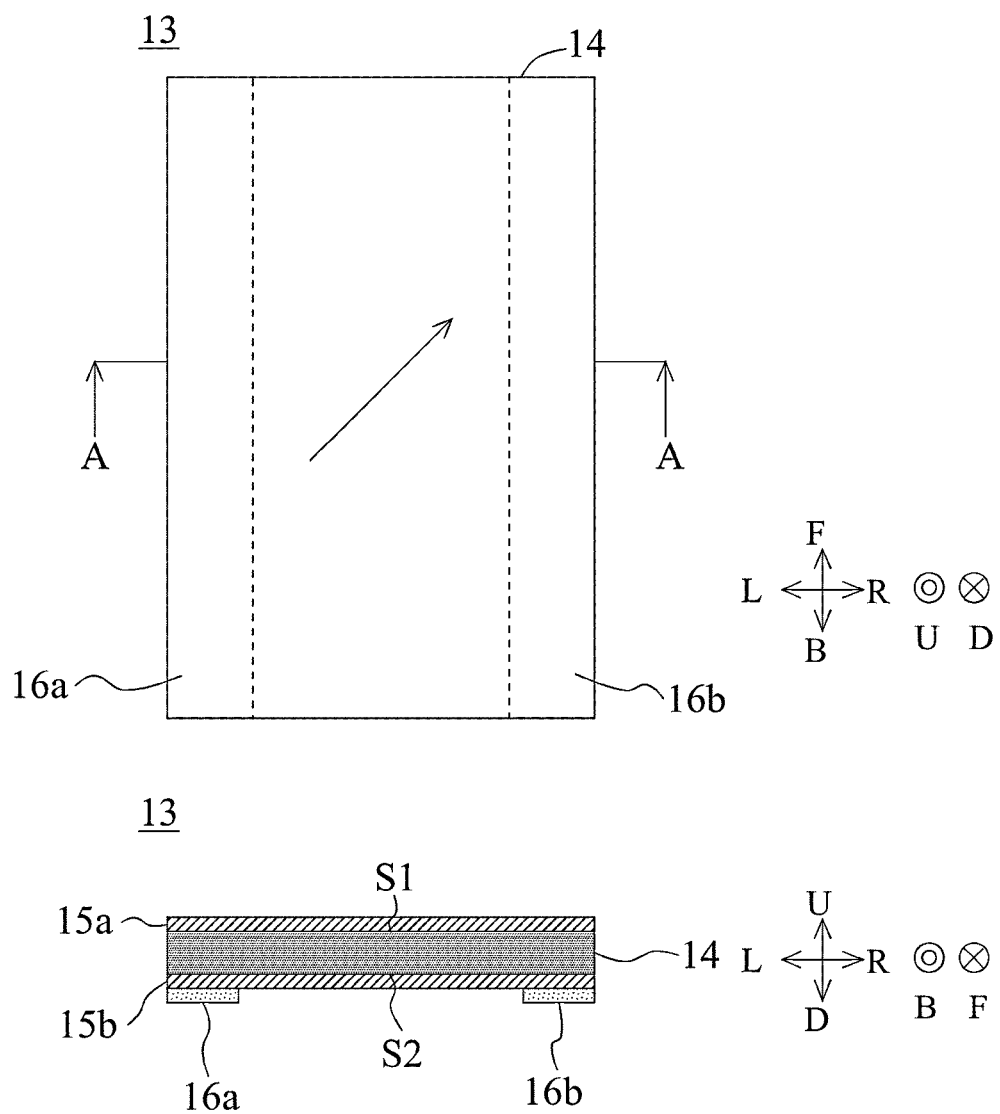
FIG. 1 is a development view of a sensor 13 and a sectional view taken along line A-A.
Figure 2:
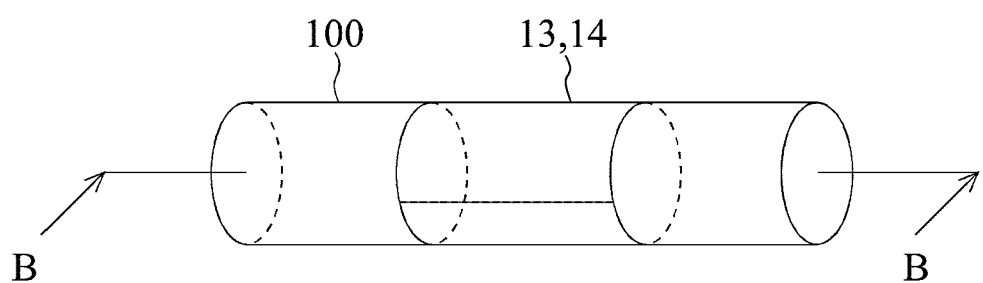
FIG. 2 is a perspective view of a state in which a sensor 13 is attached to an article 100.
Figure 3:
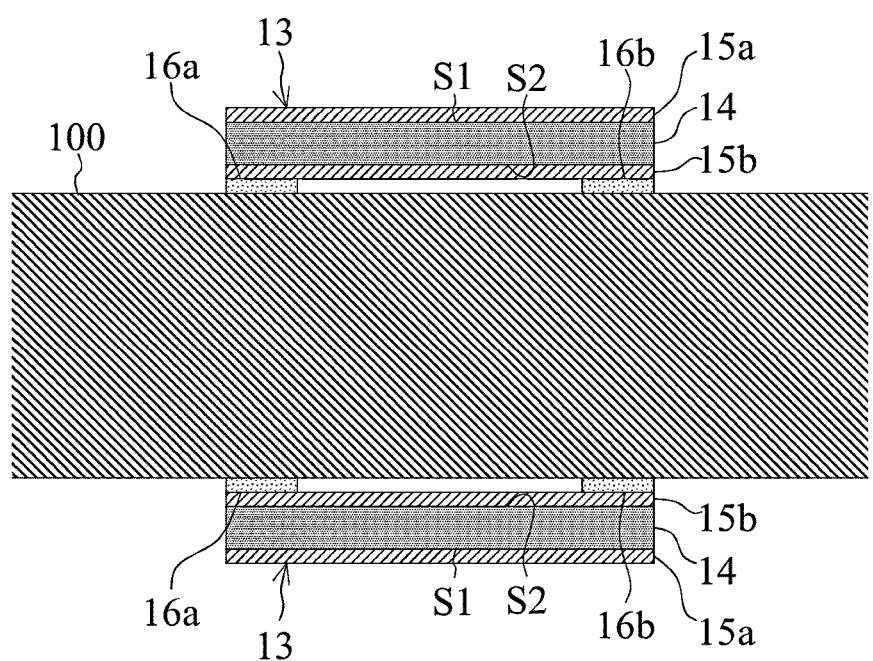
FIG. 3 is a sectional view taken along line B-B in FIG. 2.

Hereinafter, a configuration of a sensor 13 according to an embodiment of the present invention will be described with reference to the drawings. FIG. 1 is a development view of the sensor 13 and a sectional view taken along line A-A. FIG. 2 is a perspective view of a state in which the sensor 13 is attached to an article 100. FIG. 3 is a sectional view taken along line B-B in FIG. 2.

Furthermore, in the present specification, directions are defined as follows. In the sensor 13 in an unfolded state, a direction normal to a first film 14 is defined as an up-down direction. A direction in which a long side of the first film 14 extends is defined as a front-back direction. A direction in which a short side of the first film 14 extends is defined as a left-right direction. The up-down direction, the left-right direction, and the front-back direction are orthogonal to each other. Note that the definition of the directions in the present specification is an example. Therefore, the directions at the time of actual use of the sensor 13 do not need to coincide with the directions in the present specification. Further, the up-down direction may be reversed in FIG. 1. Similarly, the left-right direction in FIG. 1 may be reversed. In FIG. 1, the front-back direction may be reversed.

The sensor 13 detects deformation of the article 100 having a string shape. The string shape is an elongated flexible shape. In the present embodiment, the article 100 is a cable including a signal line as illustrated in FIG. 2. A direction in which the article 100 extends is referred to as an extending direction. As illustrated in FIG. 2, the extending direction coincides with the left-right direction. Further, a peripheral surface of the article 100 is a surface surrounding a center line of the article 100.

The sensor 13 outputs a detection signal corresponding to deformation of the article 100. Deformation of the article 100 is, for example, bending of the article 100 or twisting of the article 100. Bending of the article 100 means that a central axis of the article 100 deforms from a straight line to a curved line. Twisting of the article 100 means that the article 100 deforms around the central axis of the article 100 without deformation of the central axis of the article 100. In the present embodiment, deformation of the article 100 is bending of the article 100. As illustrated in FIG. 1, the sensor 13 includes a first film 14, a first electrode 15a, a second electrode 15b, a first fixing member 16a, and a second fixing member 16b.

As illustrated in FIG. 1, the first film 14 has a sheet shape. Therefore, the first film 14 has a first main surface S1 and a second main surface S2. The first main surface S1 is an upper main surface. The second main surface S2 is a lower main surface. The first film 14 has a rectangular shape when viewed in the up-down direction. The long side of the first film 14 extends in the front-back direction. The short side of the first film 14 extends in the left-right direction. The first film 14 generates a charge according to the deformation amount of the first film 14. The first film 14 is a piezoelectric film. In the present embodiment, the first film 14 is a PLLA film. Hereinafter, the first film 14 will be described in more detail.

The first film 14 is a film formed of a chiral polymer. The chiral polymer is, for example, polylactic acid (PLA), particularly poly-L-lactic acid (PLLA). A main chain of PLLA made of a chiral polymer has a helical structure. PLLA has piezoelectricity when it is uniaxially stretched and its molecules are oriented. Then, the first film 14 generates a charge when the first film 14 is stretched in the left-right direction or compressed in the left-right direction. When stretched in the left-right direction, the first film 14 generates, for example, a positive charge. When compressed in the left-right direction, the first film 14 generates, for example, a negative charge. The amount of charge depends on the deformation amount of the first film 14 due to tension or compression. More precisely, the amount of charge depends on a differential value of the deformation amount of the first film 14 due to tension or compression. Accordingly, a uniaxial stretching direction (orientation direction) of the first film 14 forms an angle of 45 degrees with respect to each of the front-back direction and the left-right direction. Therefore, the uniaxial stretching direction (orientation direction) of the first film 14 forms an angle of 45 degrees with respect to the left-right direction (extending direction) in a state where the first film 14 is developed. The 45-degree angle includes, for example, an angle including about 45 degrees±10 degrees.

The first electrode 15a is a ground electrode. The first electrode 15a is connected to a ground potential. As illustrated in FIG. 1, the first electrode 15a is provided on the first main surface S1. In the present embodiment, the first electrode 15a covers the whole surface of the first main surface S1. Therefore, the first electrode 15a has a rectangular shape when viewed in the up-down direction. A material of the first electrode 15a is, for example, a conductive polymer such as PEDOT.

The second electrode 15b is a signal electrode. A detection signal is output from the second electrode 15b. As illustrated in FIG. 1, the second electrode 15b is provided on the second main surface S2. As a result, the first film 14 is positioned between the first electrode 15a and the second electrode 15b. In the present embodiment, the second electrode 15b covers the whole surface of the second main surface S2. Therefore, the second electrode 15b has a rectangular shape when viewed in the up-down direction. A material of the second electrode 15b is, for example, a conductive polymer such as PEDOT.

As illustrated in FIG. 3, the first fixing member 16a and the second fixing member 16b fix the first film 14, the first electrode 15a, and the second electrode 15b to the article 100. As illustrated in FIG. 1, the first fixing member 16a and the second fixing member 16b are provided on a lower surface of the second electrode 15b. More specifically, the first film 14 has a left end portion (first end portion) and a right end portion (second end portion) in the left-right direction (extending direction). The left end portion of the first film 14 is a left long side (hereinafter, the left long side) of the first film 14. The right end portion of the first film 14 is a right long side (hereinafter, the right long side) of the first film 14. The first fixing member 16a is in contact with the left long side (first end portion) of the first film 14. The first fixing member 16a extends in the front-back direction along the whole left long side of the first film 14. The second fixing member 16b is in contact with the right long side (second end portion) of the first film 14. The second fixing member 16b extends in the front-back direction along the whole right long side of the first film 14. Therefore, the first fixing member 16a is located to the left of the second fixing member 16b. The material of the first fixing member 16a and the second fixing member 16b is, for example, an acrylic adhesive.

Further, the first fixing member 16a is separated from the second fixing member 16b in the left-right direction (extending direction). In the present embodiment, the first fixing member 16a and the second fixing member 16b do not overlap the center of the first film 14 in the left-right direction (extending direction) when viewed in the up-down direction (a direction normal to the first main surface S1 of the first film 14) in a state where the first film 14 is developed.

Here, an aspect in which the sensor 13 is fixed to the article 100 will be described. The first film 14 occupies an area equal to or more than half a peripheral surface of the article 100. In the present embodiment, as illustrated in FIG. 2, the first film 14 has a cylindrical shape due to being wrapped a single time around the peripheral surface of the article 100. The first electrode 15a and the second electrode 15b also have a cylindrical shape due to being wrapped a single time around the peripheral surface of the article 100. At this time, the first main surface S1 is a cylindrical outer peripheral surface formed by first film 14. The second main surface S2 is a cylindrical inner peripheral surface formed by the first film 14. The first electrode 15a is provided on the first main surface S1. The second electrode 15b is provided on the second main surface S2. Therefore, the second electrode 15b is located closer to the article 100 than the first electrode 15a is.

The first fixing member 16a has an annular shape when viewed in the left-right direction. The first fixing member 16a is located between the article 100 and the second electrode 15b. Thus, the first fixing member 16a fixes the second electrode 15b to the article 100.

The second fixing member 16b has an annular shape when viewed in the left-right direction. The second fixing member 16b is located between the article 100 and the second electrode 15b. Thus, the second fixing member 16b fixes the second electrode 15b to the article 100.

A portion of the second electrode 15b where the first fixing member 16a and the second fixing member 16b are not provided is not fixed to the article 100. Therefore, as illustrated in FIG. 3, there is a gap between the article 100 and the portion of the second electrode 15b where the first fixing member 16a and the second fixing member 16b are not provided. As a result, the portion of the sensor 13 where the first fixing member 16a and the second fixing member 16b are not provided is not fixed to the article 100. Note that the portion of the second electrode 15b where the first fixing member 16a and the second fixing member 16b are not provided is a portion of the second electrode 15b located between the first fixing member 16a and the second fixing member 16b as viewed in the up-down direction.

EFFECTS

Figure 4:
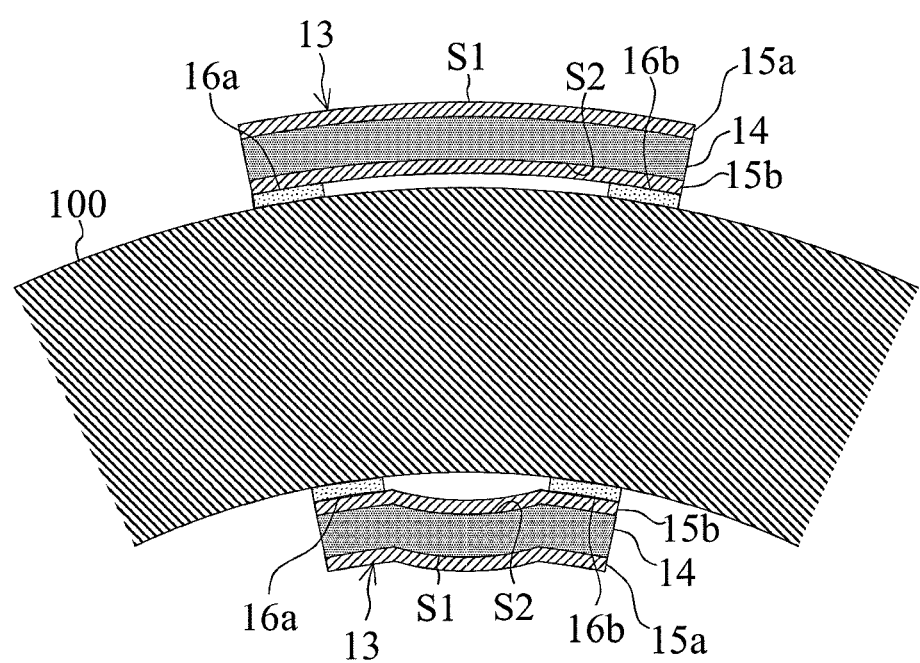
FIG. 4 is a sectional view when the article 100 is bent.

According to the sensor 13, the sensor 13 can detect deformation of the article 100 having a string shape. FIG. 4 is a sectional view when the article 100 is bent. When the article 100 is bent, a portion of the first film 14 located on an outer peripheral side of the article 100 is stretched in the left-right direction by tensile stress. On the other hand, a portion of the first film 14 located on an inner peripheral side of the article 100 is compressed in the left-right direction by compressive stress. However, the first fixing member 16a is separated from the second fixing member 16b in the left-right direction (extending direction). As a result, a portion of the second electrode 15b where the first fixing member 16a and the second fixing member 16b are not provided is not fixed to the article 100. Therefore, as illustrated in FIG. 4, a portion of the first film 14 located on the inner peripheral side of the article 100 is bent without being greatly compressed. As a result, the amount of charge generated by the portion of the first film 14 located on the inner peripheral side of the article 100 is reduced. As a result, the amount of charge generated by the portion of the first film 14 located on the outer peripheral side of the article 100 and canceled out by the charge having an opposite polarity generated by the portion of the first film 14 located on the inner peripheral side of the article 100 is reduced. Therefore, the sensor 13 can output a detection signal having a sufficient voltage. As described above, according to the sensor 13, the sensor 13 can detect deformation of the article 100 having a string shape.

According to the sensor 13, the sensor 13 can more accurately detect deformation of the article 100 having a string shape. More specifically, the first fixing member 16a is in contact with the left end portion of the first film 14. The second fixing member 16b is in contact with the right end portion of the first film 14. Therefore, when the article 100 deforms, the left end portion of the first film 14 is pulled to the left, and the right end portion of the first film 14 is pulled to the right. As a result, the whole first film 14 deforms. Therefore, the deformation amount of the first film 14 increases. As a result, a voltage of the detection signal output from the sensor 13 increases. As described above, according to the sensor 13, the sensor 13 can more accurately detect deformation of the article 100 having a string shape.

According to the sensor 13, the sensor 13 can more accurately detect deformation of the article 100 having a string shape. More specifically, a portion of the first film 14 that is most compressed when the article 100 is bent is the center of the first film 14 in the left-right direction. That is, a positive charge and a negative charge are most generated at the center of the first film 14 in the left-right direction. Therefore, in order to increase the voltage of the detection signal, it is preferable to suppress compression at the center of the first film 14 in the left-right direction. Therefore, the first fixing member 16a and the second fixing member 16b do not overlap the center of the first film 14 in the left-right direction when viewed in the up-down direction in a state where the first film 14 is developed. Therefore, the center of the first film 14 in the left-right direction is not fixed to the article 100. As a result, compression at the center of the first film 14 in the left-right direction is suppressed. As described above, the voltage of the detection signal output from the sensor 13 increases. That is, according to the sensor 13, the sensor 13 can more accurately detect deformation of the article 100 having a string shape.

According to the sensor 13, noise included in the detection signal output from the sensor 13 is reduced. More specifically, the second electrode 15b is located closer to the article 100 than the first electrode 15a. The first electrode 15a is a ground electrode. The second electrode 15b is a signal electrode. Therefore, the second electrode 15b as a signal electrode is covered with the first electrode 15a as a ground electrode. As a result, the first electrode 15a, which is the ground electrode, shields against noise. That is, the noise is suppressed from reaching the second electrode 15b which is the signal electrode. As a result, according to the sensor 13, noise included in the detection signal output from the sensor 13 is reduced. Note that, for the same reason, generation of unnecessary radiation from the sensor 13 is suppressed.

Figure 5:
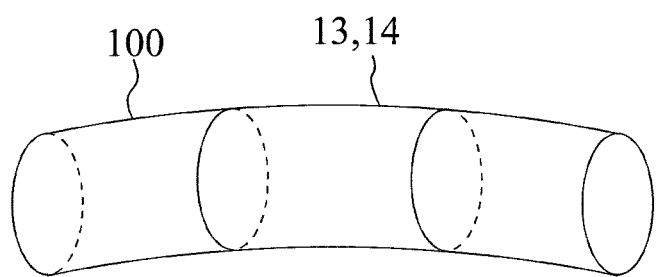
FIG. 5 is a perspective view of the sensor 13 and the article 100 in a state where the article 100 is bent.
Figure 6:
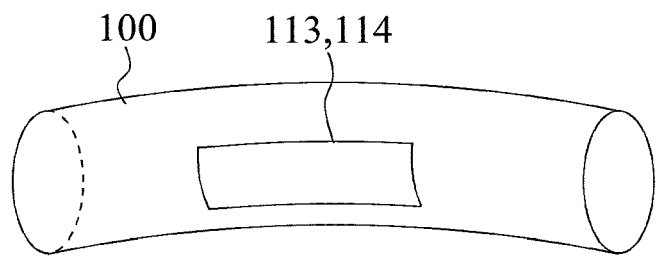
FIG. 6 is a perspective view of a sensor 113 according to a comparative example and the article 100 in a state where the article 100 is bent.

According to the sensor 13, the sensor 13 can detect bending of the article 100 in a plurality of directions. FIG. 5 is a perspective view of the sensor 13 and the article 100 in a state where the article 100 is bent. FIG. 6 is a perspective view of a sensor 113 according to a comparative example and the article 100 in a state where the article 100 is bent.

A first film 114 of the sensor 113 according to the comparative example illustrated in FIG. 6 is provided in a part of the article 100 in a circumferential direction. In this case, when the first film 114 of the sensor 113 is provided on a surface (for example, a surface on a front side of a paper surface) orthogonal to a bending direction of the article 100, the deformation amount of the first film 114 of the sensor 113 decreases. Accordingly, it may be difficult for the sensor 113 to detect bending of the article 100.

Therefore, in the sensor 13, as illustrated in FIG. 5, the first film 14 has a cylindrical shape due to being wrapped a single time around the peripheral surface of the article 100. As a result, when the sensor 13 is bent in any direction, the first film 14 sufficiently deforms. Therefore, according to the sensor 13, the sensor 13 can detect bending of the article 100 in a plurality of directions.

The sensor 13 as described above is used, for example, to detect deformation of an electric cable arranged at a joint portion of a robot arm. However, the application of the sensor 13 is not limited thereto.

FIRST MODIFICATION EXAMPLE

Next, a sensor 13a according to a first modification example will be described with reference to the drawings.

Figure 7:
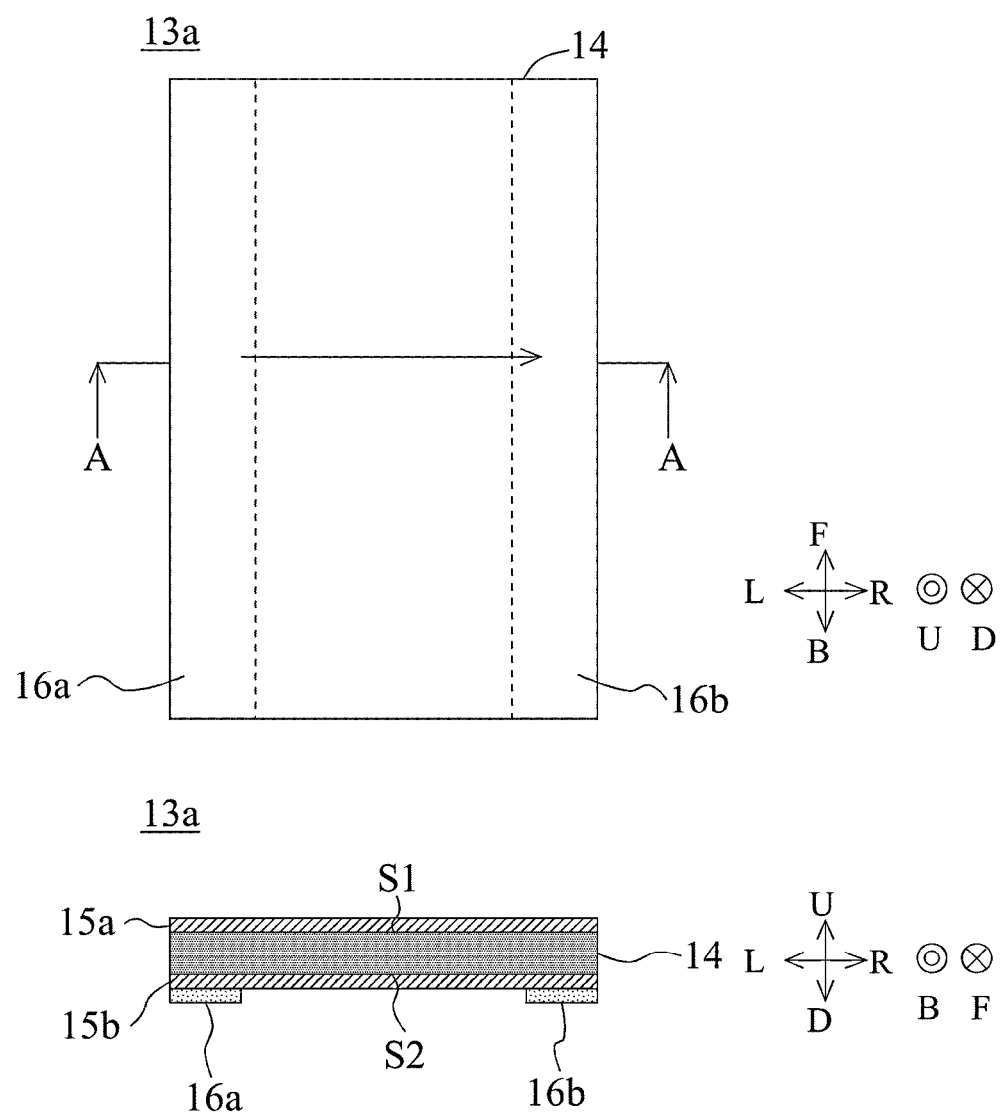
FIG. 7 is a development view of a sensor 13a and a sectional view taken along line A-A.

FIG. 7 is a development view of the sensor 13a and a sectional view taken along line A-A.

The sensor 13a is different from the sensor 13 in the orientation direction of the first film 14. In the sensor 13a, the orientation direction of the first film 14 is parallel to the left-right direction (extending direction) in a state where the first film 14 is developed. Here, parallel includes, for example, an angle shifted by about ±10 degrees from the parallel. Note that other configurations of the sensor 13a are the same as those of the sensor 13, and thus description thereof is omitted. According to such a sensor 13a, the sensor 13a can detect twisting of the article 100.

SECOND MODIFICATION EXAMPLE

Figure 8:
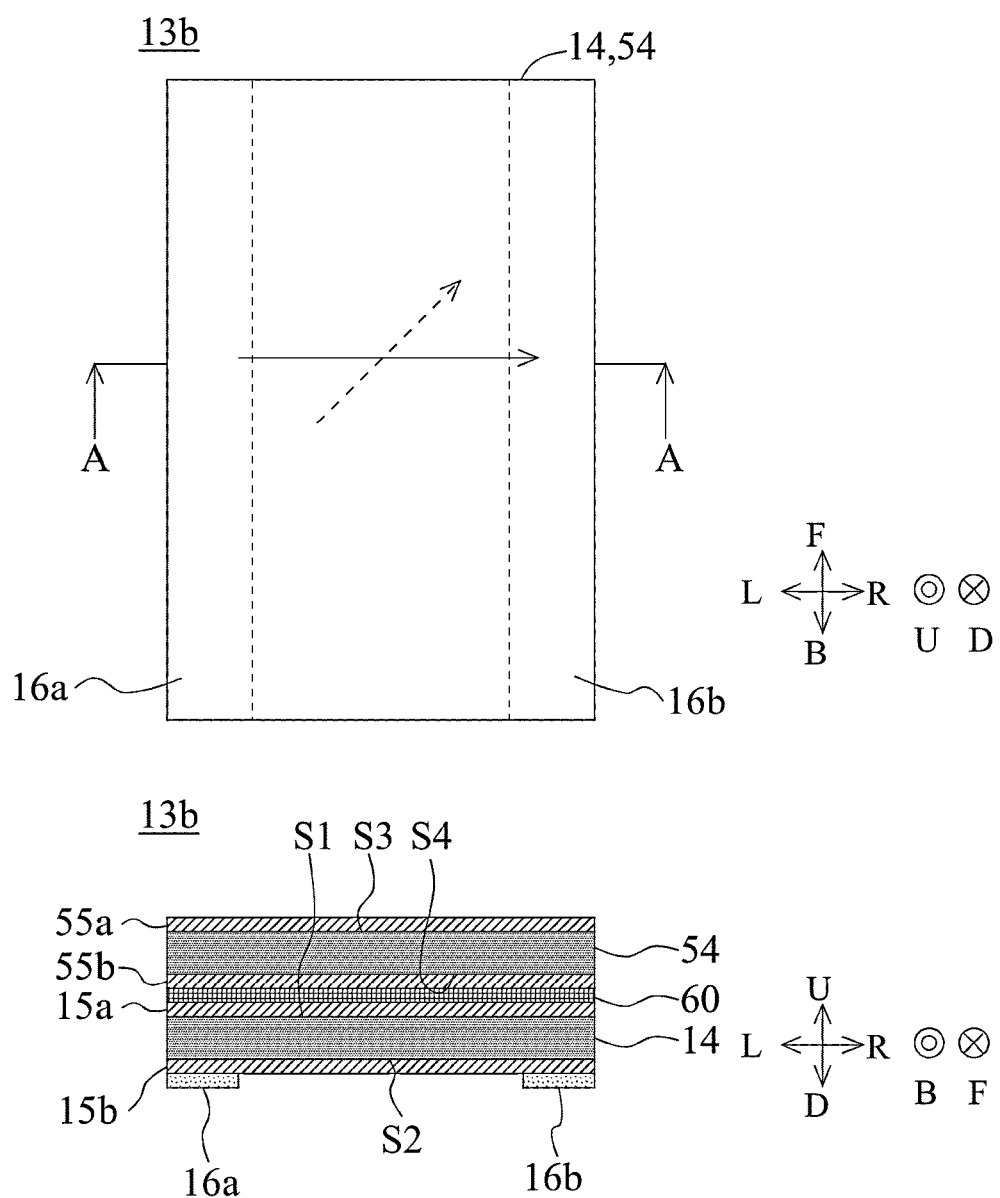
FIG. 8 is a development view of a sensor 13b and a sectional view taken along line A-A.
Figure 9:
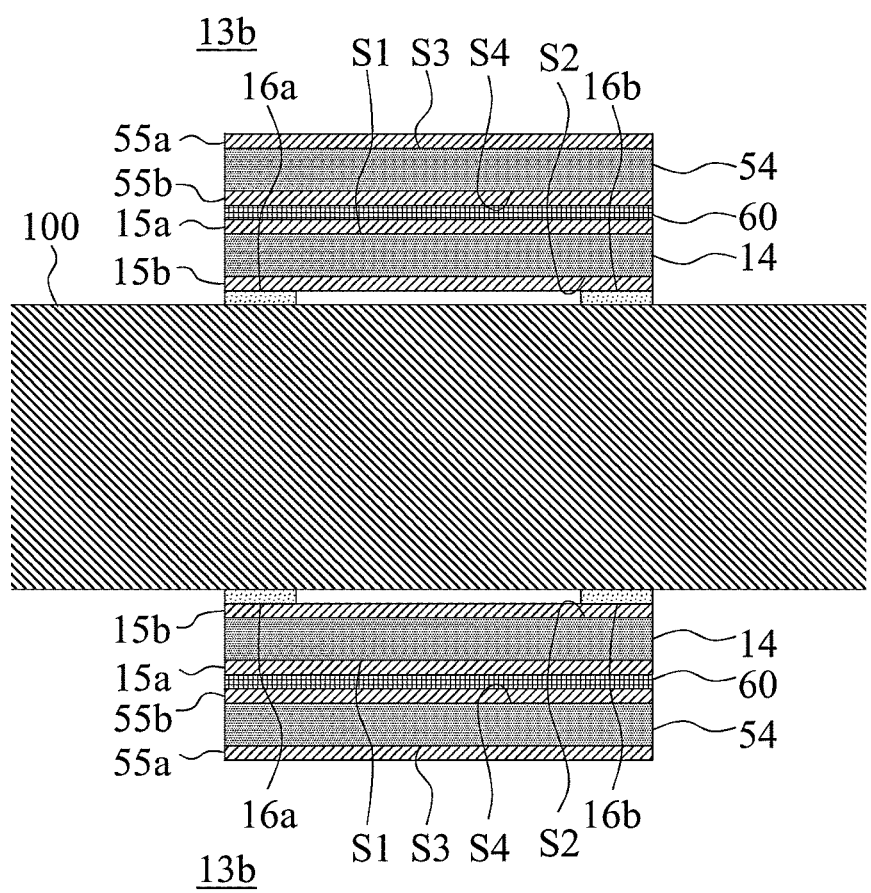
FIG. 9 is a sectional view of the sensor 13b and the article 100.

Next, a sensor 13b according to a second modification example will be described with reference to the drawings. FIG. 8 is a development view of the sensor 13b and a sectional view taken along line A-A. FIG. 9 is a sectional view of the sensor 13b and the article 100.

The sensor 13b is different from the sensor 13 in further including a second film 54, a third electrode 55a, a fourth electrode 55b, and a fixing member 60. Hereinafter, the sensor 13b will be described by focusing on this difference.

Since a first film 14, a first electrode 15a, a second electrode 15b, a first fixing member 16a, and a second fixing member 16b of the sensor 13b are the same as the first film 14, the first electrode 15a, the second electrode 15b, the first fixing member 16a, and the second fixing member 16b of the sensor 13, description thereof will be omitted.

As illustrated in FIG. 8, the second film 54 has a sheet shape. Therefore, the second film 54 has a third main surface S3 and a fourth main surface S4. The third main surface S3 is an upper main surface. The fourth main surface S4 is a lower main surface. The second film 54 has a rectangular shape when viewed in the up-down direction. A long side of the second film 54 extends in the front-back direction. A short side of the second film 54 extends in the left-right direction. An outer edge of the second film 54 coincides with the outer edge of the first film 14 when viewed in the up-down direction. The second film 54 generates a charge according to the deformation amount of the second film 54. The second film 54 is a piezoelectric film. In the present embodiment, the second film 54 is a PLLA film.

A uniaxial stretching direction (orientation direction) of the second film 54 is parallel to the left-right direction (extending direction) in a state where the second film 54 is developed. As a result, the second film 54 generates a charge when the second film 54 is stretched in a direction forming an angle of 45 degrees to the front-back direction and the left-right direction or compressed in a direction forming an angle of 45 degrees to the front-back direction and the left-right direction. When the first film 14 is stretched in a direction forming an angle of 45 degrees to the front-back direction and the left-right direction, the first film generates, for example, a positive charge. When the first film 14 is compressed in a direction forming an angle of 45 degrees to the front-back direction and the left-right direction, the first film generates, for example, a negative charge. The amount of charge depends on the deformation amount of the first film 14 due to tension or compression. More precisely, the amount of charge depends on a differential value of the deformation amount of the first film 14 due to tension or compression.

The third electrode 55a is a ground electrode. The third electrode 55a is connected to a ground potential. As illustrated in FIG. 8, the third electrode 55a is provided on the third main surface S3. In the present embodiment, the third electrode 55a covers the whole surface of the third main surface S3. Therefore, the third electrode 55a has a rectangular shape when viewed in the up-down direction. The material of the third electrode 55a is, for example, a conductive polymer such as PEDOT.

The fourth electrode 55b is a signal electrode. A detection signal is output from the fourth electrode 55b. As illustrated in FIG. 8, the fourth electrode 55b is provided on the fourth main surface S4. As a result, the second film 54 is positioned between the third electrode 55a and the fourth electrode 55b. In the present embodiment, the fourth electrode 55b covers the whole surface of the fourth main surface S4. Therefore, the fourth electrode 55b has a rectangular shape when viewed in the up-down direction. The material of the fourth electrode 55b is, for example, a conductive polymer such as PEDOT.

The fixing member 60 bonds the fourth electrode 55b and the first electrode 15a. As a result, the first film 14 and the second film 54 overlap each other. The material of the fixing member 60 is, for example, an acrylic adhesive.

Further, as illustrated in FIG. 9, the second film 54 has a cylindrical shape due to being wrapped a single time around the peripheral surface of the first electrode 15a. At this time, the fourth electrode 55b is located closer to the article 100 than the third electrode 55a is.

According to the sensor 13b, the sensor 13b can detect bending and twisting of the article 100 having a string shape.

THIRD MODIFICATION EXAMPLE

Figure 10:
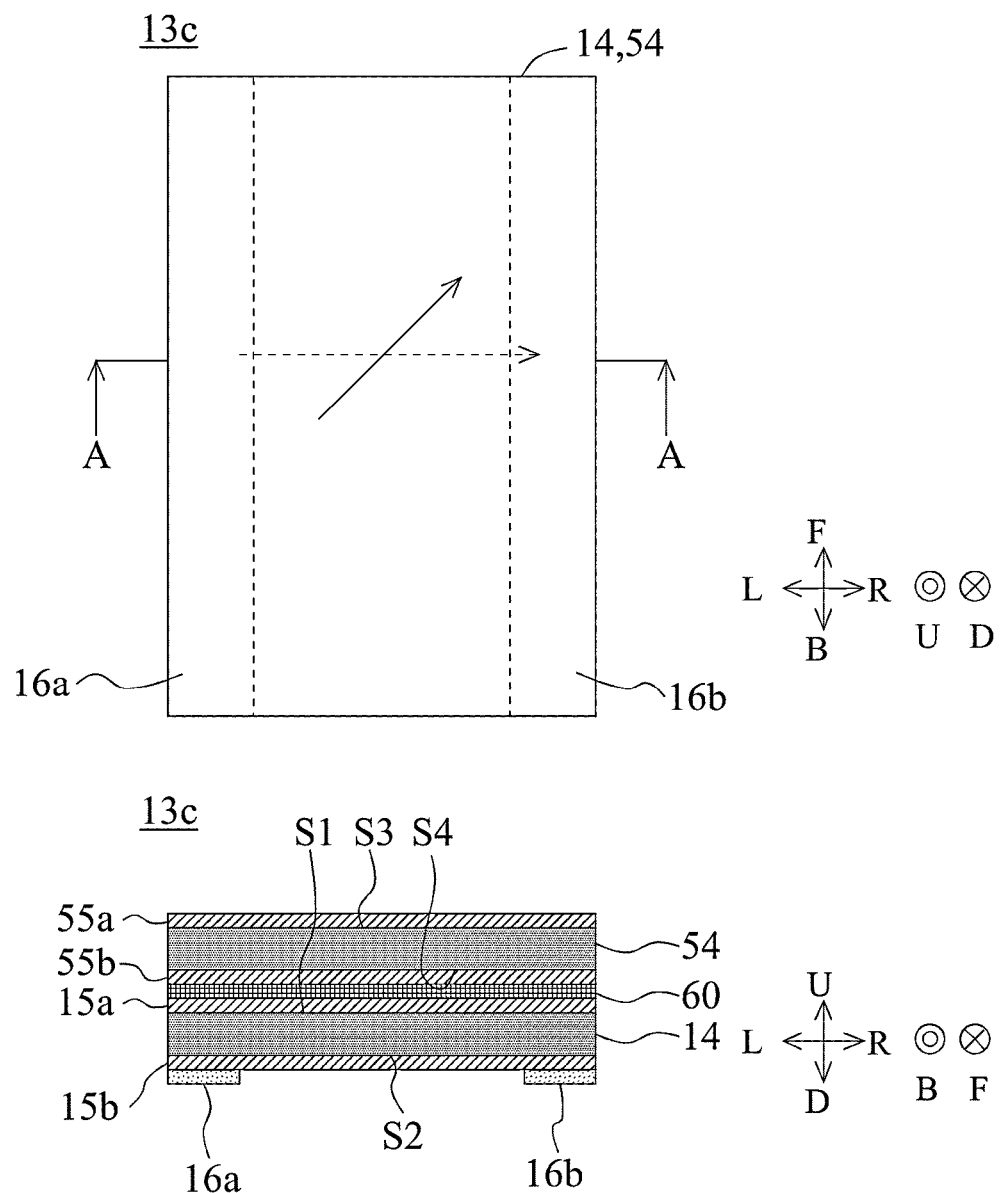
FIG. 10 is a development view of a sensor 13c and a sectional view taken along line A-A.

Next, a sensor 13c according to a third modification example will be described with reference to the drawings. FIG. 10 is a development view of the sensor 13c and a sectional view taken along line A-A.

The sensor 13c is different from the sensor 13b in the orientation direction of the first film 14 and the orientation direction of the second film 54. Specifically, in the sensor 13c, the orientation direction of the first film 14 is parallel to the left-right direction (extending direction) in a state where the first film 14 is developed. The orientation direction of the second film 54 forms an angle of 45 degrees with respect to the left-right direction (extending direction) in a state where the second film 54 is developed. Other configurations of the sensor 13c are the same as those of the sensor 13b, and thus description thereof is omitted.

According to the sensor 13c, the sensor 13c can detect bending and twisting of the article 100 having a string shape.

FOURTH MODIFICATION EXAMPLE

Figure 11:
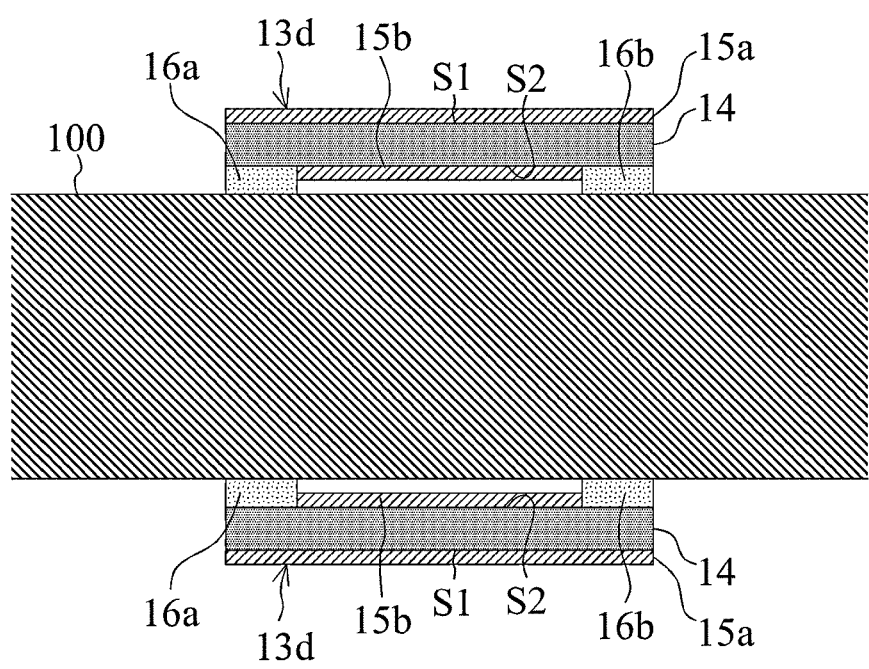
FIG. 11 is a sectional view of a sensor 13d and the article 100.

Next, a sensor 13d according to a fourth modification example will be described with reference to the drawings. FIG. 11 is a sectional view of the sensor 13d and the article 100.

The sensor 13d is different from the sensor 13 in the structure of the first fixing member 16a, the second fixing member 16b, and the second electrode 15b. More specifically, the first fixing member 16a and the second fixing member 16b do not overlap the second electrode 15b when viewed in the up-down direction (direction normal to the first main surface S1 of the first film 14) in a state where the first film 14 is developed. Therefore, the second electrode 15b is not provided on the whole surface of the second main surface S2 of the first film 14. The first fixing member 16a and the second fixing member 16b are in contact with the second main surface S2 of the first film 14. Thus, the first fixing member 16a and the second fixing member 16b fix the first film 14 to the article 100.

According to the sensor 13d, the sensor 13d can more accurately detect deformation of the article 100 having a string shape. More specifically, portions of the first film 14 overlapping the first fixing member 16a and the second fixing member 16b as viewed in the up-down direction are fixed to the article 100. When the article 100 is bent, the portions of the first film 14 overlapping the first fixing member 16a and the second fixing member 16b as viewed in the up-down direction are stretched or compressed in the left-right direction. Accordingly, in the portions of the first film 14 overlapping the first fixing member 16a and the second fixing member 16b when viewed in the up-down direction, a positive charge and a negative charge are likely to be canceled out. Therefore, the first fixing member 16a and the second fixing member 16b do not overlap the second electrode 15b when viewed in the up-down direction (direction normal to the first main surface S1 of the first film 14) in a state where the first film 14 is developed. As a result, the charge generated in the portions of the first film 14 overlapping the first fixing member 16a and the second fixing member 16b when viewed in the up-down direction does not contribute to generation of the detection signal. As a result, according to the sensor 13d, the sensor 13d can more accurately detect deformation of the article 100 having a string shape.

FIFTH MODIFICATION EXAMPLE

Figure 12:
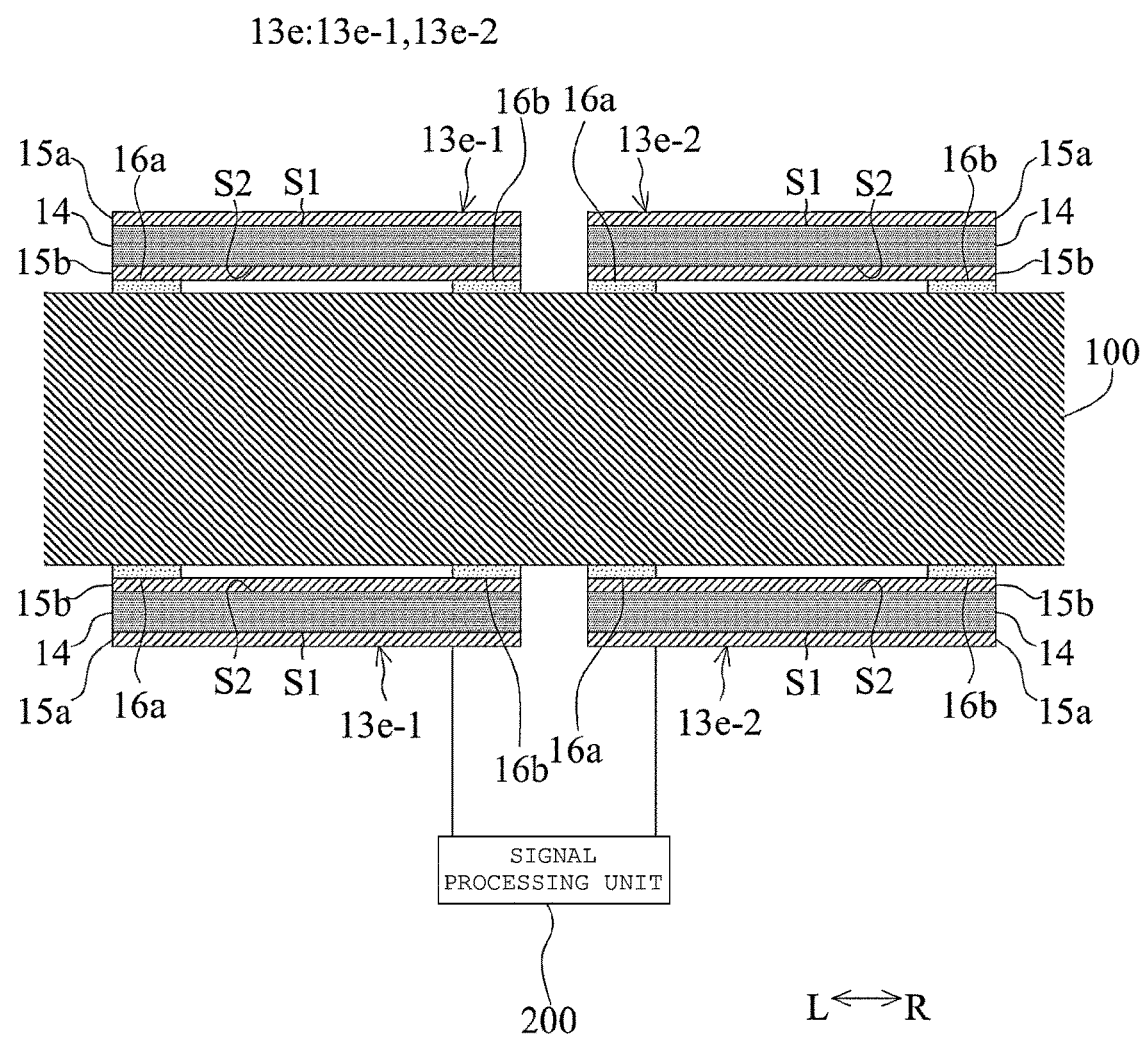
FIG. 12 is a sectional view of a sensor 13e and the article 100.
Figure 13:
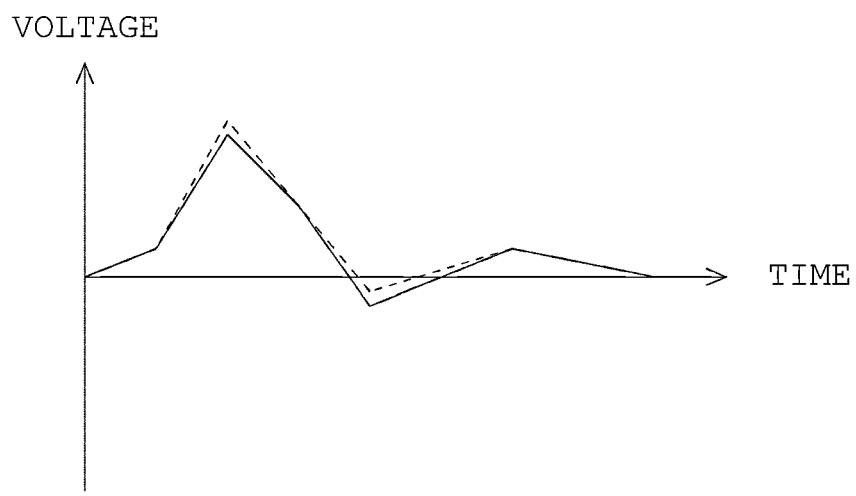
FIG. 13 is a graph illustrating waveforms of a first detection signal and a second detection signal output from sensors 13e-1 and 13e-2, respectively.
Figure 14:
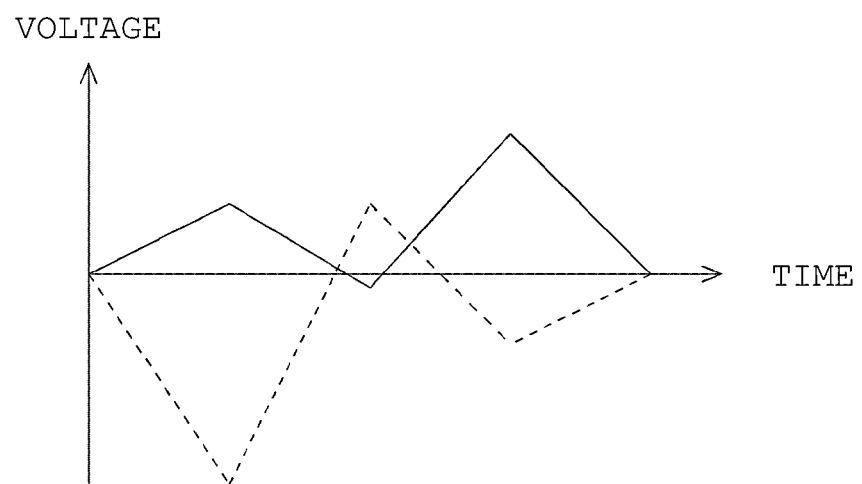
FIG. 14 is a graph illustrating waveforms of a first detection signal and a second detection signal output from the sensors 13e-1 and 13e-2, respectively.

Next, a sensor 13e according to a fifth modification example will be described with reference to the drawings. FIG. 12 is a sectional view of the sensor 13e and the article 100. FIGS. 13 and 14 are graphs illustrating waveforms of a first detection signal and a second detection signal output from each of sensors 13e-1 and 13e-2. The vertical axis represents a voltage. The horizontal axis represents time. A solid line indicates the first detection signal. A dotted line indicates the second detection signal.

The sensor 13e includes sensors 13e-1 and 13e-2. The sensors 13e-1 and 13e-2 are arranged side by side on the article 100. The distance between the sensor 13e-1 and the sensor 13e-2 is relatively small. Since the structure of the sensors 13e-1 and 13e-2 is the same as that of the sensor 13, description thereof will be omitted.

The sensors 13e-1 and 13e-2 are connected to a signal processing unit 200. The signal processing unit 200 detects deformation of the article 100 on the basis of the first detection signal and the second detection signal output from the sensors 13e-1 and 13e-2, respectively. The signal processing unit 200 is realized by, for example, a central processing unit (CPU).

Further, the signal processing unit 200 can determine whether bending has occurred in the article 100 or an impact has been applied to the article 100 on the basis of the first detection signal and the second detection signal. Specifically, when bending occurs in the article 100, bending also occurs in the sensor 13e-1 and the sensor 13e-2. The distance between the sensor 13e-1 and the sensor 13e-2 is relatively small. Accordingly, bending generated in the sensor 13e-1 is similar to the bending generated in the sensor 13e-2. Therefore, as illustrated in FIG. 13, the first detection signal and the second detection signal have similar values.

On the other hand, when an impact is applied to the article 100, for example, an impact applied to the sensor 13e-1 becomes larger than an impact applied to the sensor 13e-2. In this case, the deformation generated in the sensor 13e-1 is different from the deformation generated in the sensor 13e-2. Therefore, as illustrated in FIG. 14, the first detection signal and the second detection signal have different values.

Therefore, the signal processing unit 200 can determine whether bending has occurred in the article 100 or an impact has been applied to the article 100 on the basis of the first detection signal and the second detection signal.

SIXTH MODIFICATION EXAMPLE

Figure 15:
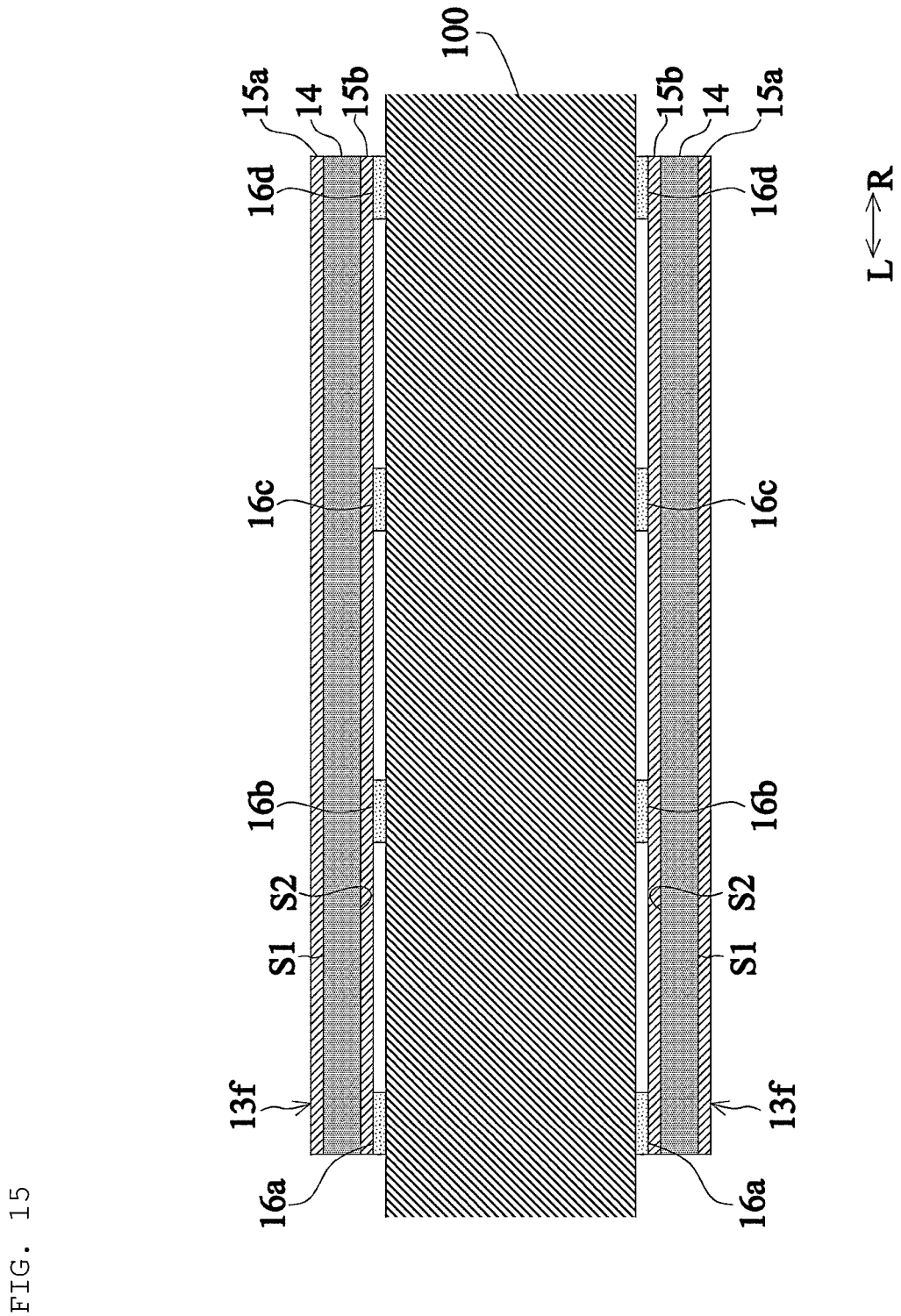
FIG. 15 is a sectional view of a sensor 13f and the article 100.

Next, a sensor 13f according to a sixth modification example will be described with reference to the drawings. FIG. 15 is a sectional view of the sensor 13f.

The sensor 13f is different from the sensor 13 in further including a third fixing member 16c and a fourth fixing member 16d. The first fixing member 16a, the second fixing member 16b, the third fixing member 16c, and the fourth fixing member 16d are arranged in this order in the left-right direction (extending direction). In the present embodiment, the first fixing member 16a, the second fixing member 16b, the third fixing member 16c, and the fourth fixing member 16d are arranged at equal intervals in this order from left to right. Therefore, the second fixing member 16b is separated from the first fixing member 16a in the left-right direction (extending direction). The third fixing member 16c is separated from the second fixing member 16b in the left-right direction (extending direction). The fourth fixing member 16d is separated from the third fixing member 16c in the left-right direction (extending direction).

Further, the first fixing member 16a, the second fixing member 16b, the third fixing member 16c, and the fourth fixing member 16d fix the first film 14, the first electrode 15a, and the second electrode 15b to the article 100.

According to the sensor 13f, the four fixing members including the first fixing member 16a, the second fixing member 16b, the third fixing member 16c, and the fourth fixing member 16d fix the sensor 13f to the article 100 at intervals in the left-right direction. As a result, the sensor 13f elongated in the left-right direction can be fixed to the article 100. Therefore, the sensor 13f can detect deformation in a wider range of the article 100.

SEVENTH MODIFICATION EXAMPLE

Figure 16:
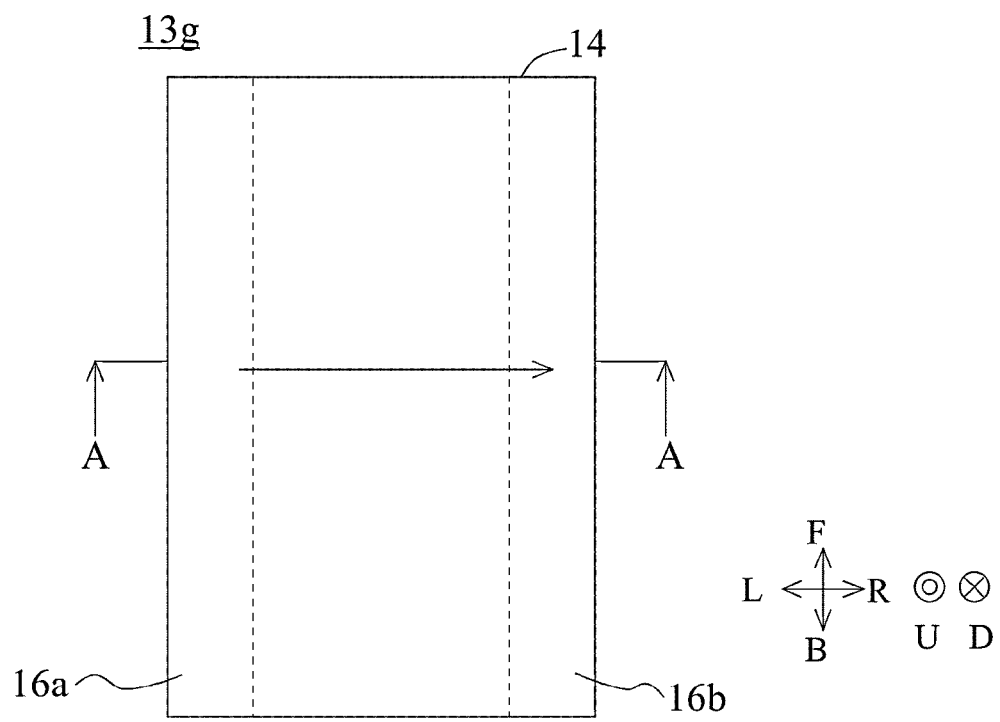
FIG. 16 is a development view of a sensor 13g and a sectional view taken along line A-A.
Figure 16:
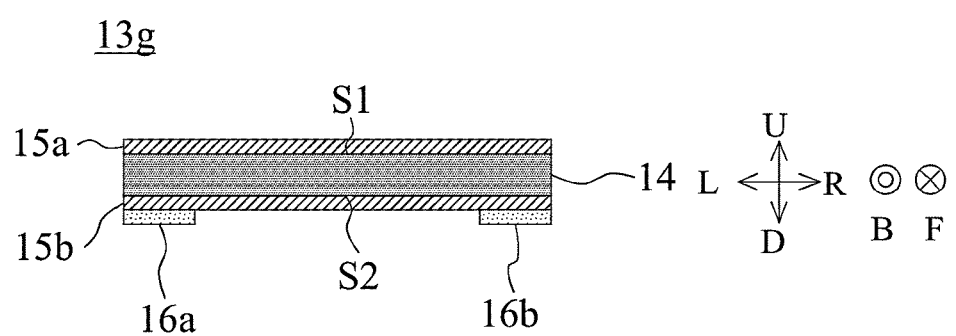

Next, a sensor 13g according to a seventh modification example will be described with reference to the drawings. FIG. 16 is a development view of the sensor 13g and a sectional view taken along line A-A.

The sensor 13g is different from the sensor 13 in that the first film 14 is a polyvinylidene fluoride (PVDF) film. In this case, as illustrated in FIG. 16, the orientation direction of the first film 14 is parallel to the left-right direction (extending direction) in a state where the first film 14 is developed. Note that other configurations of the sensor 13g are the same as those of the sensor 13, and thus description thereof is omitted.

According to the sensor 13g, the sensor 13g can detect bending of the article 100. Further, the PVDF film has higher sensitivity than the PLLA film. Therefore, the sensor 13g has high sensitivity.

EIGHTH MODIFICATION EXAMPLE

Figure 17:
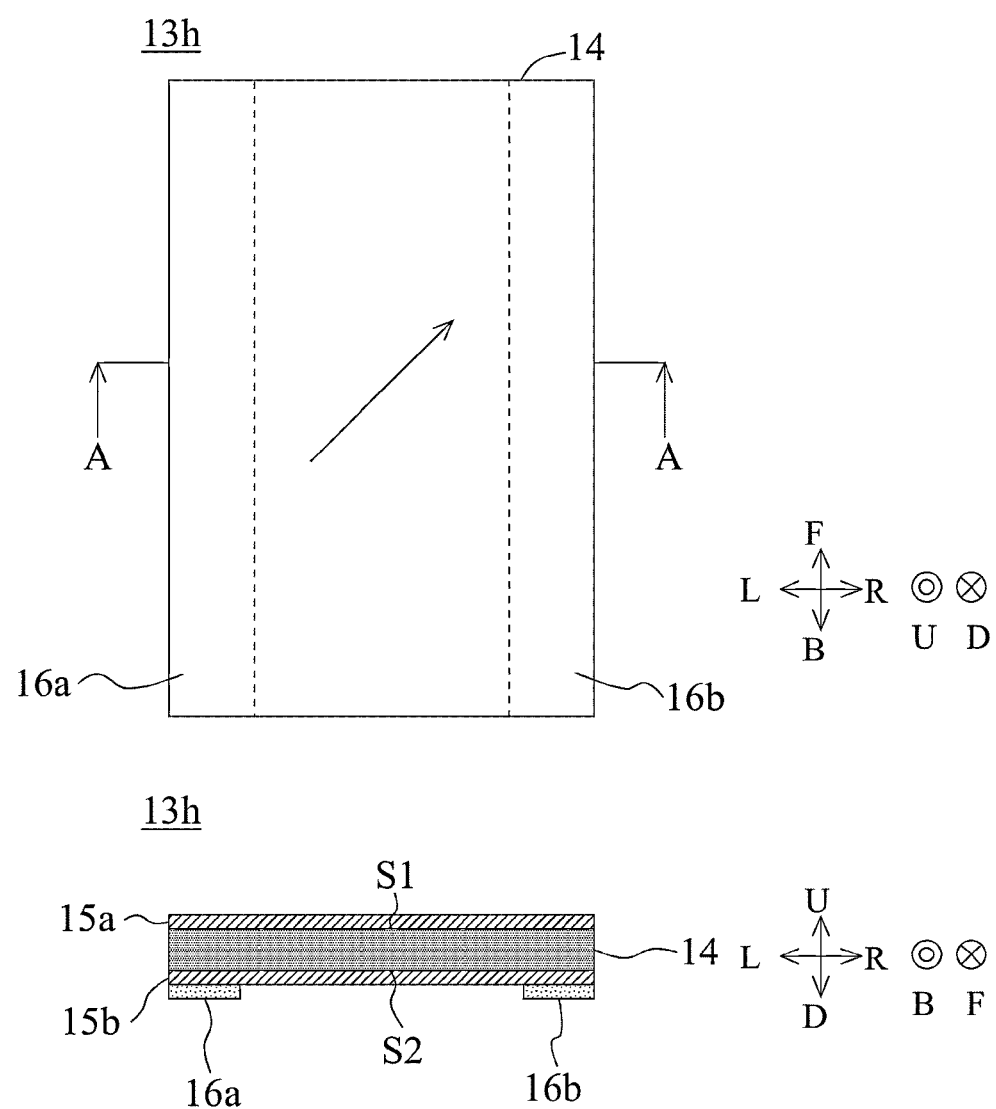
FIG. 17 is a development view of a sensor 13h and a sectional view taken along line A-A.

Next, a sensor 13h according to an eighth modification example will be described with reference to the drawings. FIG. 17 is a development view of the sensor 13h and a sectional view taken along line A-A.

The sensor 13h is different from the sensor 13g in the orientation direction of the first film 14. In the sensor 13h, as illustrated in FIG. 17, the orientation direction of the first film 14 forms an angle of 45 degrees with respect to the left-right direction (extending direction) in a state where the first film 14 is developed. Note that other configurations of the sensor 13h are the same as those of the sensor 13g, and thus, description thereof is omitted.

According to the sensor 13h, the sensor 13h can detect twisting of the article 100. Further, the PVDF film has higher sensitivity than the PLLA film. Therefore, the sensor 13h has high sensitivity.

OTHER EMBODIMENTS

An electronic device according to the present invention is not limited to the sensors 13 and 13a to 13g, and can be modified within the scope of the gist thereof. In addition, the configurations of the sensors 13 and 13a to 13g may be appropriately combined.

Note that the article 100 is not limited to a cable. The article 100 may have a string shape. Therefore, the article 100 may be, for example, a tube or the like. In addition, the shape of a cross section orthogonal to the extending direction of the article 100 is not limited to a circular shape and may be a rectangular shape or the like.

Note that the sensors 13 and 13a to 13g are not limited to piezoelectric sensors. The sensors 13 and 13a to 13g may be strain sensors, for example.

Note that, in the sensors 13 and 13a to 13g, the first electrode 15a is not limited to covering the whole surface of the first main surface S1.

In addition, in the sensors 13b and 13c, the first electrode 15a is not limited to covering the whole surface of the first main surface S1. The second electrode 15b is not limited to covering the whole surface of the second main surface S2. The third electrode 55a is not limited to covering the whole surface of the third main surface S3. The fourth electrode 55b is not limited to covering the whole surface of the fourth main surface S4.

Note that, in the sensors 13, 13a to 13e, 13g, and 13h, the first fixing member 16a is not limited to being in contact with the left end portion of the first film 14. The second fixing member 16b is not limited to being in contact with the right end portion of the first film 14.

Note that, in the sensors 13, 13a to 13e, 13g, and 13h, the first fixing member 16a and the second fixing member 16b may overlap the center of the first film 14 in the left-right direction as viewed in the up-down direction in a state where the first film 14 is developed.

In addition, in the sensors 13, 13a to 13e, 13g, and 13h, the first electrode 15a may be a signal electrode. The second electrode 15b may be a ground electrode. However, the first electrode 15a is preferably covered with a protective layer such as a resist.

DESCRIPTION OF REFERENCE SYMBOLS 13, 13a to 13h, 13e-1, 13e-2: Sensor
14: First film
15a: First electrode
15b: Second electrode
16a: First fixing member
16b: Second fixing member
16c: Third fixing member
16d: Fourth fixing member
54: Second film
55a: Third electrode
55b: Fourth electrode
60: Fixing member
100: Article
200: Signal processing unit
S1: First main surface
S2: Second main surface
S3: Third main surface
S4: Fourth main surface

The invention claimed is:

1. A sensor that detects deformation of an article having a string shape, the sensor comprising:
   a first film having a first main surface and a second main surface, the first film generating a charge according to a deformation amount of the first film;
   a first electrode on the first main surface;
   a second electrode on the second main surface; and
   a first fixing member and a second fixing member constructed to fix the first film, the first electrode, and the second electrode to the article,
   wherein
   the first film is dimensioned to occupy an area equal to or more than half a peripheral surface of the article,
   the second electrode is located closer to the article than the first electrode, and
   the first fixing member is separated from the second fixing member in an extending direction of the article.

2. The sensor according to claim 1, wherein the first film has a cylindrical shape matching the peripheral surface of the article.

3. The sensor according to claim 2, wherein the first film has is dimensioned to wrap around the peripheral surface of the article a single time.

4. The sensor according to claim 1, wherein the first film is a piezoelectric film.

5. The sensor according to claim 4, wherein the first film is a PLLA film.

6. The sensor according to claim 5, wherein an orientation direction of the first film is at an angle of 45 degrees with respect to the extending direction of the article.

7. The sensor according to claim 6, further comprising:
   a second film having a third main surface and a fourth main surface, the second film generating a charge according to a deformation amount of the second film;
   a third electrode on the third main surface; and
   a fourth electrode on the fourth main surface, wherein
   the second film is a PLLA film,
   the second film has a cylindrical shape matching a peripheral surface of the first electrode,
   the fourth electrode is located closer to the article than the third electrode, and
   an orientation direction of the second film is parallel to the extending direction of the article.

8. The sensor according to claim 7, wherein the second film has is dimensioned to wrap around the peripheral surface of the first electrode a single time.

9. The sensor according to claim 5, wherein an orientation direction of the first film is parallel to the extending direction of the article.

10. The sensor according to claim 9, further comprising:
    a second film having a third main surface and a fourth main surface, the second film generating a charge according to a deformation amount of the second film;
    a third electrode on the third main surface; and
    a fourth electrode on the fourth main surface, wherein
    the second film is a PLLA film, the second film has a cylindrical shape matching a peripheral surface of the first electrode, the fourth electrode is located closer to the article than the third electrode, and an orientation direction of the second film forms an angle of 45 degrees with respect to the extending direction of the article.

11. The sensor according to claim 10, wherein the second film has is dimensioned to wrap around the peripheral surface of the first electrode a single time.

12. The sensor according to claim 4, wherein the first film is a PVDF film.

13. The sensor according to claim 12, wherein an orientation direction of the first film forms an angle of 45 degrees with respect to the extending direction of the article.

14. The sensor according to claim 12, wherein an orientation direction of the first film is parallel to the extending direction of the article.

15. The sensor according to claim 1, wherein the first film has a first end portion and a second end portion in the extending direction, the first fixing member is in contact with the first end portion, and the second fixing member is in contact with the second end portion.

16. The sensor according to claim 1, wherein the first fixing member and the second fixing member do not overlap a center of the first film in the extending direction as viewed in a direction normal to the first main surface of the first film.

17. The sensor according to claim 1, wherein the first fixing member and the second fixing member do not overlap the second electrode when viewed in a direction normal to the first main surface of the first film.

18. The sensor according to claim 1, further comprising a third fixing member, wherein the first fixing member, the second fixing member, and the third fixing member are arranged in this order in the extending direction, the third fixing member is separated from the second fixing member in the extending direction, and the third fixing member fixes the first film, the first electrode, and the second electrode to the article.

19. The sensor according to claim 1, wherein the first electrode is a ground electrode, and the second electrode is a signal electrode.

* * * * *